United States Patent
Desrosiers et al.

(10) Patent No.: US 7,474,532 B1
(45) Date of Patent: Jan. 6, 2009

(54) HEAT SINK RESTRAINTS FOR CALIBRATED MATING PRESSURE AND SHOCK ABSORPTION

(75) Inventors: Norman Bruce Desrosiers, Oxford, NC (US); Michael Dudley French, Jr., Raleigh, NC (US); Dean Frederick Herring, Youngsville, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/847,613

(22) Filed: Aug. 30, 2007

(51) Int. Cl.
*H05K 7/20* (2006.01)
*F28F 7/00* (2006.01)
*H01L 23/34* (2006.01)

(52) U.S. Cl. ............ 361/719; 165/80.3; 165/185; 257/719; 361/704

(58) Field of Classification Search ......... 257/718–719; 361/719
See application file for complete search history.

(56) References Cited

U.S. PATENT DOCUMENTS

| | | | |
|---|---|---|---|
| 4,193,445 A * | 3/1980 | Chu et al. ............ 165/79 |
| 4,753,287 A * | 6/1988 | Horne ............ 165/80.3 |
| 5,757,621 A | 5/1998 | Patel |
| 6,501,658 B2 | 12/2002 | Pearson et al. |
| 6,504,722 B2 * | 1/2003 | Vittet et al. .......... 361/704 |
| 6,549,410 B1 | 4/2003 | Cohen |
| 6,826,054 B2 * | 11/2004 | Liu ............ 361/719 |
| 6,829,143 B2 * | 12/2004 | Russell et al. ........ 361/704 |
| 6,866,540 B2 | 3/2005 | Robertson |
| 6,920,052 B2 | 7/2005 | Callahan et al. |
| 6,967,833 B2 * | 11/2005 | Boykin et al. ........ 361/685 |
| 7,011,187 B2 | 3/2006 | Steinbeck |
| 7,064,957 B1 | 6/2006 | Liang et al. |
| 7,116,556 B2 * | 10/2006 | Lee et al. ............ 361/704 |
| 7,161,808 B2 | 1/2007 | Atkinson |
| 7,164,583 B2 * | 1/2007 | Lee et al. ............ 361/704 |
| 7,180,743 B2 | 2/2007 | Chen et al. |
| 7,262,969 B2 * | 8/2007 | Lee et al. ............ 361/704 |
| 7,283,368 B2 * | 10/2007 | Wung et al. .......... 361/719 |
| 7,342,795 B2 * | 3/2008 | Lee et al. ............ 361/719 |
| 7,359,200 B2 * | 4/2008 | Zhou et al. ........... 361/704 |
| 7,405,939 B2 * | 7/2008 | Yang ............ 361/719 |
| 2005/0117305 A1 | 6/2005 | Ulen et al. |

\* cited by examiner

*Primary Examiner*—Gregory D Thompson
(74) *Attorney, Agent, or Firm*—Cynthia Bryd; Jeffrey L. Streets

(57) ABSTRACT

A heat sink restraint that absorbs shock and facilitates the application of a calibrated hold-down force to a heat sink. The restraint comprises a fluid-tight housing and a piston assembly including a piston and a shaft. The shaft has first and second ends extending from the housing through seals that allow axial movement of the shaft. The piston is disposed within the housing for axial movement with the shaft. A dampening fluid fills the housing about the piston assembly and a dampening orifice or passageway establishes restricted fluid communication between regions within the housing above and below the piston. A spring is disposed within the housing between the piston and the housing to bias the housing in a retaining direction. A first end of the shaft is selectively coupled to a circuit board and the second end includes a visual indicator for indicating the amount of the applied hold-down force.

17 Claims, 4 Drawing Sheets

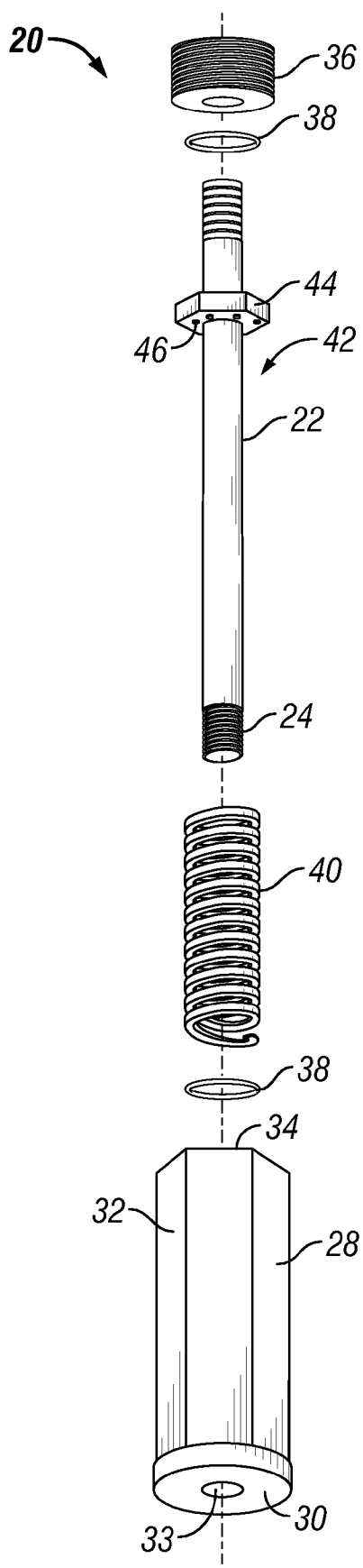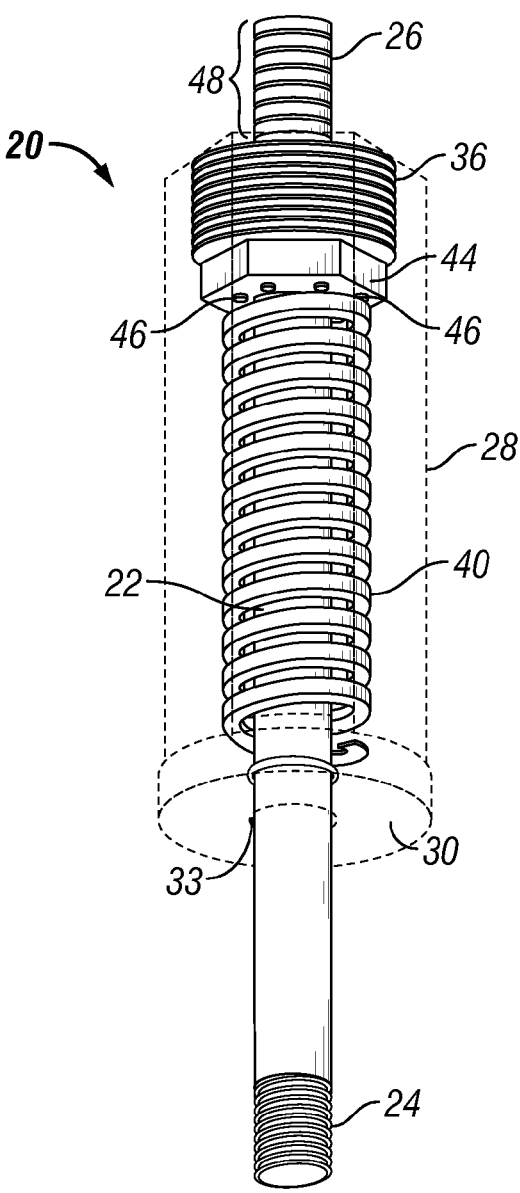
FIG. 3
FIG. 4

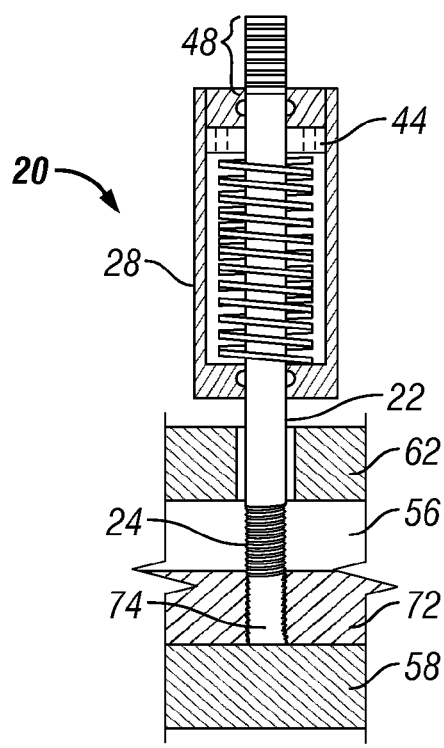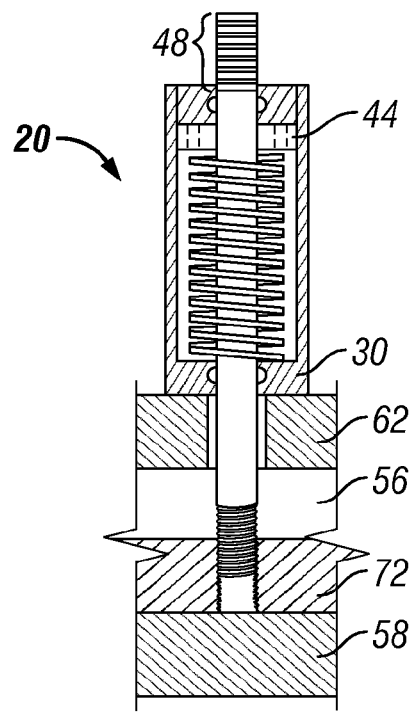
FIG. 8  FIG. 9
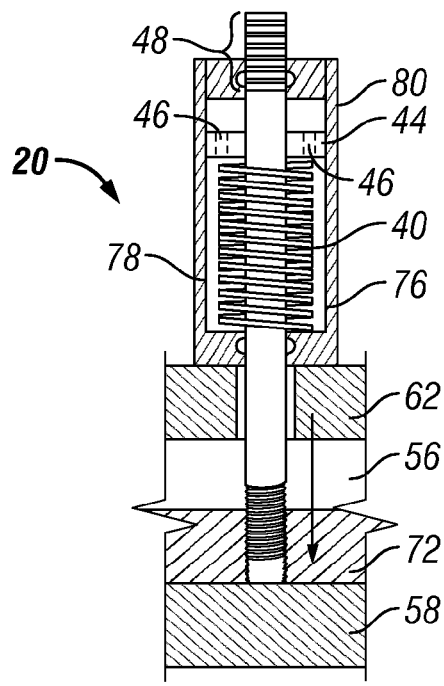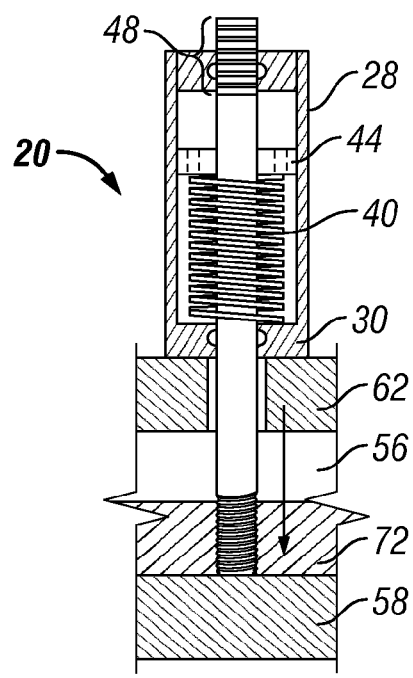
FIG. 10  FIG. 11

HEAT SINK RESTRAINTS FOR CALIBRATED MATING PRESSURE AND SHOCK ABSORPTION

BACKGROUND OF THE INVENTION

1. Field of the Invention

The present invention relates to a method and apparatus for securing a heat sink above a processor installed in a computer.

2. Description of the Related Art

Heat sinks are a vital part of any computer system. The heat generated by continued and extended use of a computer can severely damage the electrical components in the computer. Heat sinks provide a way for the heat to be transferred away from the source and away from critical components. To increase the amount of thermal transfer, heat sinks typically include a large surface area or a large number of thermally conductive fins. However, heavy heat sinks must be secured directly to the computer chassis in order to avoid transmitting inertial shock and vibration forces of the heat sink to the processor and the circuit board, possibility damaging the interface between the processor and the circuit board.

The contact area and pressure between the heat sink and the electrical components are also important considerations in heat sink design. A heat sink with a flat contact area is preferred since a thinner layer of thermal compound may be used. This reduces the thermal resistance between the heat sink and the heat source. The pressure between the heat sink and the heat source is typically high in order to maintain the requisite thermal contact and to facilitate thermal flow. Simple mechanical clips may help maintain the requisite pressure between the surface of the heat sink and the processor, but such clips are usually difficult to install and are not reliable when the computer is being shipped. Jarring that can occur during shipping or computer operation has the potential to cause disengagement of the electrical contacts between the processor and it's socket, causing the system to crash or significant contact damage.

The recent proliferation of Land Grid Array (LGA) sockets have created another problem that must be considered during heat sink design and particularly in the manner in which heat sinks or other cooling devices are attached to the socket/processor assembly. Current LGA socket designs frequently contain heat sinks as part of the assembly. The heat sink base is usually used as one of the loading plates in the assembly and is typically attached to a back-side stiffener using multiple screws or spring-loaded threaded fasteners.

Unfortunately, heat sinks may also transfer shock and vibration to the processor causing damage to the processor/socket interface. Physical shock may occur when a computer chassis is handled abruptly or dropped. Vibration may be caused by various components, such as a fan motor mounted to or adjacent to the heat sink. However, it is desirable to avoid transmitting physical shock and vibration to the processor. Consequently, the heat sinks may be supported by a shock absorber to reduce shock and vibration between the heat sink and the circuit board.

Aside from shock and vibration, the heat sink should be secured to the processor with a certain hold down force in order to maintain contact and high thermal communication between the processor and the heat sink. In fact, the hold down force may also be responsible for maintaining contact between the processor and a land grid array below the processor. For these reasons, it is desirable to connect the heat sink in a manner that provides a desired hold-down force but limits any 'bounce' or upward movement lessening the clamping force or breaking electrical contact.

Therefore, there is a need for an apparatus that secured a heat sink to a processor and to precisely deliver a desired hold-down force. It would be desirable to have a heat sink restraint assembly that was easy to use. It would also be desirable to have a heat sink restraint that was able to provide a range of desired hold-down forces and could be used with processors having a range of heights. It would be even further desirable if the heat sink restraint provided a visual indicator of the hold-down force that was being applied.

SUMMARY OF THE INVENTION

One embodiment of the present invention provides a heat sink restraint that absorbs shock and facilitates the application of a calibrated hold-down force to a heat sink. The heat sink restraint comprises a fluid tight housing and a piston assembly including a piston and a shaft. The shaft extends through the housing and has first and second ends extending out of the housing through seals that allow axial movement of the shaft relative to the housing. The piston is disposed within the housing and coupled to the shaft for axial movement with the shaft. A dampening fluid fills the housing about the piston assembly and a dampening orifice or passageway establishes restricted fluid communication between regions within the housing above and below the piston. Optionally, the dampening orifice or passageway may extend between the piston and the walls of the cylinder or comprise one or more holes through the piston. In addition, a spring is disposed within the housing between the piston and the housing to bias the housing in a retaining direction.

Preferably, a first end of the shaft is threaded for coupling to a circuit board via rotation of the shaft. For example, the shaft may be directly coupled to the motherboard or coupled to a heat sink retention module. The second end of the shaft may have a visual indicator for indicating the amount of axial displacement of the shaft relative to the housing. Most preferably, the visual indicator moves into the housing under continued rotation of the threaded shaft after the housing engages the heat sink. In one embodiment, the visual indicator of the shaft has a series of markings spaced apart along its length above the housing.

Another embodiment of the present invention provides an apparatus, comprising a circuit board, a semiconductor device coupled to the circuit board, a heat sink, and a plurality of restraints coupled to the circuit board and securing the heat sink in thermal communication with the semiconductor device.

BRIEF DESCRIPTION OF THE DRAWINGS

FIG. 3 is an exploded assembly view of a heat sink restraint.

FIG. 4 is a side perspective view of a heat sink restraint with a transparent housing to show the arrangement of assembled components.

FIG. 8 is a partial side view of the assembly of FIG. 7 with the heat sink restraint positioned to begin threaded engagement with the retention module.

FIG. 9 is a partial side view of the assembly of FIG. 7 with the heat sink restraint in threaded engagement with the retention module to the point that the housing makes initial contact with the heat sink base.

FIG. 10 is a partial side view of the assembly of FIG. 7 with the heat sink restraint in threaded engagement with the retention module to the point that the piston begins to compress the spring and fluid has been displaced to the region above the piston.

FIG. 11 is a partial side view of the assembly of FIG. 7 with the heat sink restraint in threaded engagement with the retention module to a point that the visual displacement indicator indicates that a desired, precalibrated force is being applied.

DETAILED DESCRIPTION

Figure 1:
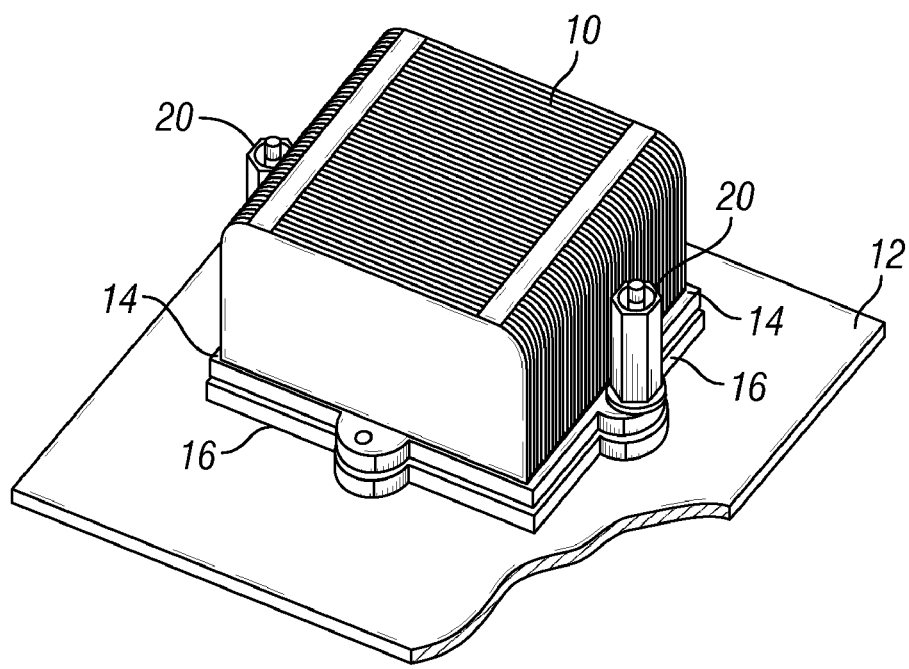
FIG. 1 is a perspective view of a heat sink secured in thermal communication with a processor on a circuit board using a heat sink restraint.

One embodiment of the present invention is a heat sink restraint that absorbs shock and facilitates the application of a calibrated hold-down force to a heat sink. The heat sink restraint comprises a fluid tight housing and a piston assembly including a piston and a shaft. The shaft extends through the housing and has first and second ends extending out of the housing through seals that allow axial movement of the shaft relative to the housing. The piston is disposed within the housing and is coupled to the shaft for axial movement with the shaft. A dampening fluid fills the housing about the piston assembly and a dampening orifice or passageway establishes restricted fluid communication between regions within the housing above and below the piston. Optionally, the dampening orifice or passageway may extend between the piston and the walls of the cylinder or comprise one or more holes through the piston. In addition, a spring is disposed within the housing between the piston assembly and the housing to bias the housing in a retaining direction. The spring is preferably positioned below the piston to be placed in compression, but may secured above the piston to be place in tension. A coil spring is preferably, but other types of springs may also be employed.

Preferably, a first end of the shaft is threaded for coupling to a circuit board via rotation of the shaft. However, other types of fasteners may be used to couple the shaft to the circuit board or to a retention module, tray or chassis. For example, the shaft may be directly coupled to the motherboard or coupled to a heat sink retention module. The second end of the shaft may have a visual indicator for indicating the amount of axial displacement of the shaft relative to the housing. Most preferably, the visual indicator moves into the housing under continued rotation of the threaded shaft after the housing engages the heat sink. In one embodiment, the visual indicator of the shaft has a series of markings spaced apart along its length above the housing.

Another embodiment of the present invention provides an apparatus, comprising a circuit board, a semiconductor device coupled to the circuit board, a heat sink, and a plurality of restraints coupled to the circuit board and securing the heat sink in thermal communication with the semiconductor device.

The heat sink restraint will typically be used in conjunction with a heat sink having a heat sink base that will be placed in thermal communication with the processor. Typically, the exposed face of the processor will be planar and the exposed face of the heat sink base will also be planar. This and other arrangements for full face-to-face contact provide good thermal communication between the two components. Thermal grease or other thermally conductive or thermally enhancing materials may be juxtaposed there between, but are not necessary. The heat sink base may include, without limitation, a solid metal or metal alloy plate, a thermally conductive composite, or a vapor chamber. The heat sink base also secures heat dissipating features, such as cooling fins, heat pipes and the like, that extend into an air flow passageway for cooling. In accordance with the invention, the heat sink base is selectively securable to the retention module for thermal communication of the heat sink with a processor.

It should be recognized that embodiments of the invention may apply a calibrated clamping force between the heat sink base and the processor when the heat sink is secured to the circuit board or a retention module, tray or chassis. Using the restraint of the invention, the displacement of the piston determines the amount of clamping force or pressure that will be applied to the processor even though different processors may have different heights. For example, a processor that is taller than another processor would generally require less travel (such as fewer turns of the threaded shaft) before the restraint housing will make contact with the heat sink base and provide a desired clamping force. Similarly, using the restraint with a processor that requires a greater clamping force than another processor of the same height would generally require additional travel (such as more turns of the threaded shaft) to achieve greater compression of the spring. Accordingly, it is possible to determine the exact amount of travel that should be used with the restraint to achieve a particular pressure. It is a distinct advantage of the invention that the same heat sink restraint may be utilized with various processors having a range of heights and suggested pressures.

Another embodiment of the invention provides a heat sink assembly. The heat sink assembly comprises a heat sink restraint and a heat sink having a base. A heat sink assembly may be used in association with any of a plurality of processors having different heights and pressure requirements simply by applying the appropriate amount of travel or advancement of the piston assembly after the restraint housing has made contact with the heat sink base.

FIG. 1 is a perspective view of a heat sink 10 secured in thermal communication with a processor (not shown) on a circuit board 12 using a pair of heat sink restraints 20. The restraints 20 apply a calibrated hold-down force on the base 14 of the heat sink 10. In this illustration, the heat sink base 14 is received in a retention module 16 that is independently secured to the circuit board 12, such as through mounting holes in the circuit board. Any number of restraints 20 may be used to secure a single heat sink, but the restraints are preferably arranged to apply a uniform hold-down force over the surface of the processor. In the present illustration, two restraints 20 are disposed on opposing sides of the heat sink. Optionally, four restraints may be located with each restraint along one of the four sides or at each of the four corners. Other suitable arrangements will become apparent to others after gaining an understanding of the invention.

Figure 2:
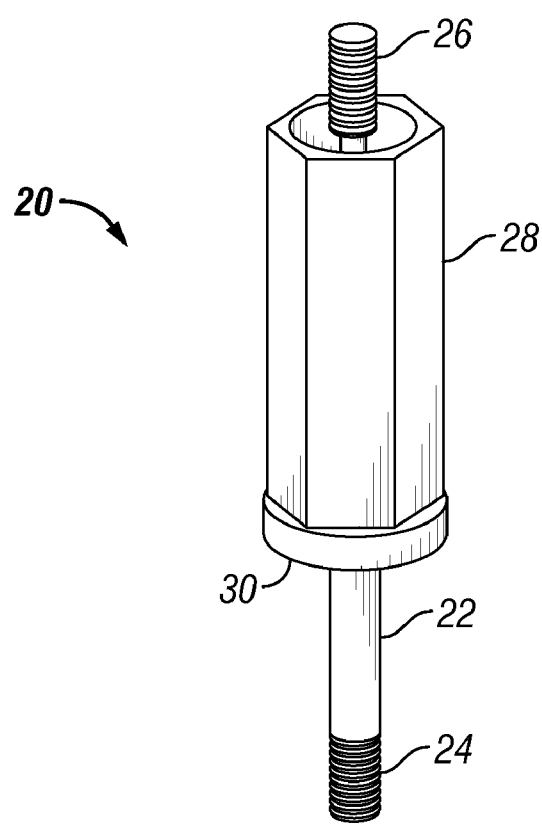
FIG. 2 is a perspective view of a heat sink restraint.

FIG. 2 is a perspective view of a heat sink restraint 20. The restraint 20 includes a shaft 22 having a first end 24 for fastening to a circuit board, retention module, tray or chassis and a second end 26 having visual indicator of shaft displacement relative to the housing 28. The shaft 22 extends through the housing 28 and is axially movable and rotatable. A distal end of the housing 28 forms a contact pad 30 that engages the heat sink base. In a preferred embodiment, the housing 28 has a cross-sectional profile that is a polygon, such as a hexagon that is easily gripped with a standard wrench. The housing 28 is fluid tight and holds a fluid. The fluid is preferably a thick or viscous fluid, such as the thermal grease that is already approved for use in the heat sink environment.

FIG. 3 is an exploded assembly view of a heat sink restraint 20. Beginning at the bottom of FIG. 3, a housing 28 has a contact pad 30, a hexagon outer surface 32, and a hollow interior (not shown). A hole 33 through the contact pad 30 is provided to receive the shaft 22. The housing 28 initially has an open top 34 that is threaded to sealingly receive a plug 36 as a final step in assembling the restraint 20. O-ring seals 38 are used within the hole 33 and the plug 36 to provide fluid seals about the shaft 22 that will extend there through.

A coil spring 40 has a diameter slightly smaller than the inner diameter of the housing 28 so that the spring is received within the housing but remains substantially axially upright. A central passageway through the spring 40 receives the shaft 22 of a piston assembly 42 and allows the shaft 22 to extend through the hole 33 in the contact pad 30 of the housing 28. The shaft 22 is extended through the hole 33 until the bottom face of the piston 44 rests on the top end of the spring 40. The piston 44 includes a plurality of holes or orifices 46 provide restricted fluid communication from the region below the piston to the region above the piston.

FIG. 4 is a side perspective view of a heat sink restraint 20 with a transparent housing 28 to show the arrangement of assembled components. When the restraint 20 is fully assembly, the void spaces within the housing 28 are full of fluid. This fluid may pass through the orifices 46 of the piston 44 as the spring 40 is compressed and the piston 44 moves axially toward the contact pad 30. With the plug 36 secured to the top portion 34 to seal the housing 28 the fluid does not escape the housing, but simply passes through the orifices 46 to slow movement of the piston. Accordingly, the fluid limits the transmission of shock and vibration through the restraint 20, but does not alter the compression of the spring 40.

As shown, the piston 44 has a hexagonal shape or profile that fits snugly or sealingly against the inner surface of the housing 28. This mating of the piston and housing not only forces the fluid through the orifices 46, but also causes the piston assembly 42 (comprising the shaft 22 and piston 44 as shown in FIG. 3) to rotate along with rotation of the housing 28. Accordingly, rotating the housing 28 by hand or with a wrench will cause rotation of the piston assembly 42. If the threads 24 are standard right-hand threads, then clockwise rotation of the housing causes the threads 24 to advance into the circuit board, retention module, tray or chassis. If the contact pad 30 is already in contact with a heat sink base, then this threaded advancement draws the piston axially through the housing 28 and compresses the spring 40. Continued clockwise rotation of the housing 28 increases the compressive forces in the spring and the hold-down force of the contact pad 30 against the heat sink base (not shown). Similarly, counter-clockwise rotation of the housing would retract the piston and decrease the hold-down force.

In accordance with the present invention, the foregoing structure allows a second end 26 of the shaft 22 to serve as a visual indicator of how far the piston assembly has advanced relative to the housing. Because the hold-down force is a function of this distance, the invention allows a user to apply a desired force by turning the housing until the visual indicator shows the appropriate distance has been achieved. In a preferred arrangement, the second end 26 includes a visual indicator 48 that is made up of a series of axially spaced apart lines or grooves that indicate incremental changes in the hold-down force over a range of typical forces. The overall axial length of the visual indicator is determined by the physical properties or performance of the spring 40. In particular, the spring constant, k, measured in force per length, is a measure of the spring that relates the force exerted by a spring to the distance it is stretched or compressed. The visual indicator may include markings or lines at distances that correspond with any one or more desired hold-down force.

Figure 5:
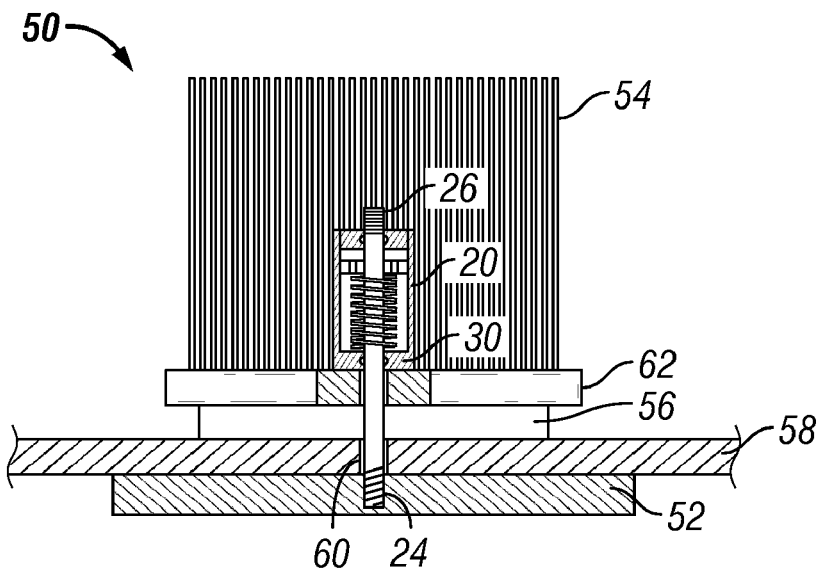
FIG. 5 is a side view of an assembly including a heat sink restraint coupled to a backing member and securing a heat sink to the processor at a calibrated pressure.

FIG. 5 is a side view of an assembly 50 including a heat sink restraint 20 coupled to a backing member 52 and securing a heat sink 54 to the processor 56 at a calibrated pressure. The processor 56 is positioned on a circuit board 58 having through holes 60. The restraint 20 has the contact pad 30 engaging the heat sink base 62 and the shaft end 24 extending past the processor, through the hole 60 in the circuit board, and threadably coupled into the backing member 52. As previously described, turning the housing of the restraint 20 advances the threads into the backing member 52 to increase the hold-down force that the restrain 20 applies to the heat sink base 62. When the visual indicator shows that the desired hold-down force has been reached, the restraint housing should not be turned any further. Adjustments in the hold-down force can be accomplished easily by turning the housing one way or the other until the visual indicator shows the desired hold-down force.

Figure 6:
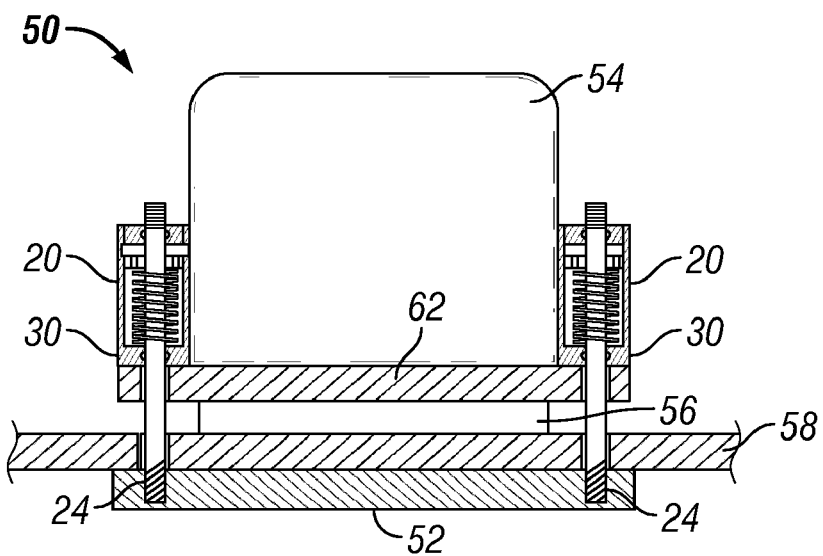
FIG. 6 is an end view of the assembly of FIG. 5.

FIG. 6 is an end view of the assembly 50 of FIG. 5. From this view, it is apparent that two of the heat sink restraints 20 are being used on directly opposing sides of the heat sink 54. This arrangement facilitates a uniform application of the combined hold-down force provided by the two restraints 20. In practice, any number of restraints may be used, but it is preferred to use two or more restraints that are symmetrically arranged to avoid an uneven application of force.

Figure 7:
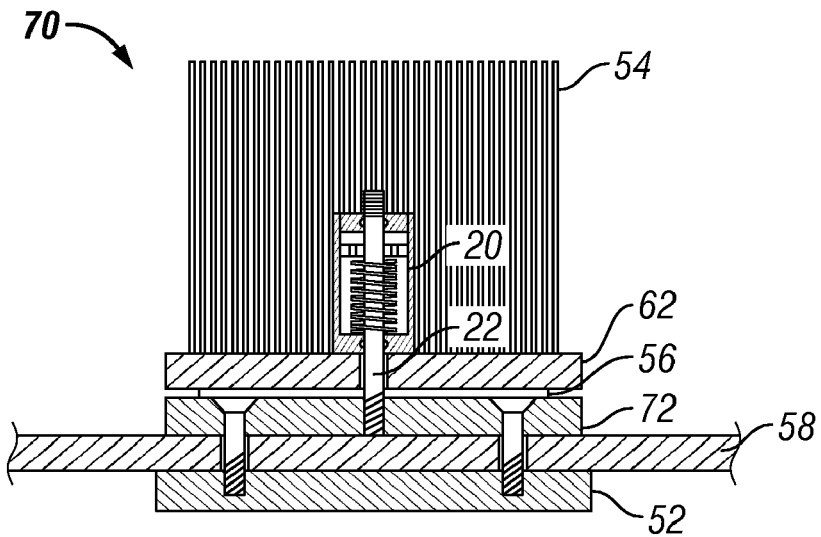
FIG. 7 is a side view of an assembly including a heat sink restraint coupled to a retention module and securing a heat sink to the processor at a calibrated pressure.

FIG. 7 is a side view of an assembly 70 including a heat sink restraint 20 coupled to a retention module 72 and securing a heat sink 54 to the processor 56 at a calibrated pressure. The use of the retention module 72 does not alter the function of the restraint 20, but represents an alternative configuration for coupling the restraint to the circuit board 58. A typical retention module 72 may itself be secured to a backing member 52 below the circuit board 58 using screws, bolts or other fasteners. The retention module 72 may therefore form a fixed frame around the processor 56. It may then be easier to threadably secure the restraint 20 to the retention module 72, which is above the circuit board 58, than to threadably secure the restraint to a backing member below the circuit board, as in FIGS. 5 and 6. Alignment of the heat sink may also be improved with the use of the retention module 72. While the overall length of the shaft 22 may be shortened for use with a retention module, there is no change in the operation or function of the restraint.

FIGS. 8 to 11 are partial side views of the assembly 70 of FIG. 7 illustrating the stepwise operation of the restraint 20 to secure a heat sink and apply a calibrated hold-down force. In FIG. 8, the heat sink restraint 20 has been positioned to begin threaded engagement of the shaft end 24 with a threaded hole 74 in the retention module 72. Turning the housing 28, as previously described, will turn the piston 44 and the shaft 22 in the same direction. In FIG. 9, the heat sink restraint 20 is threadably coupled with the retention module 72 to the point that the contact pad 30 makes initial contact with the heat sink base 62. Still, no significant hold-down force has been applied, as shown by the entirety of the visual indicator 48 remaining unchanged.

FIG. 10 shows the heat sink restraint 20 with the shaft in further threaded advancement with the retention module 72 to the point that the piston 44 begins to compress the spring 40 and fluid 76 has been displaced from the region 78 below the piston 44, through the orifices 46, and into the region 80 above the piston 44. The compressed the spring 40 is secured against the bottom of the piston 44 and exerts a hold-down force on the contact pad 30, which exerts the same hold-down force on the heat sink base 62. It can be seen that the visual indicator 48 has partially retracted into the housing such that one of the indicator lines is no longer visible. The high viscosity of the fluid 76 and the restricted fluid communication of the orifices 46 act to limit the transmission of shock and vibration. However, while the flow of the fluid is not instantaneous, such flow will equilibrate and the fluid will not have any net effect on the spring or the hold-down forces applied with the spring.

FIG. 11 shows the heat sink restraint 20 threadably engaged with the retention module 72 to a point that only two of the five lines in the visual indicator 48 are still visible above the housing 28. Accordingly, the known distance that the spring 40 has been compressed corresponds to a precalibrated hold-down force that the spring 40 is applying against the contact pad 30 and, therefore, against the heat sink base 62. The process illustrated in FIGS. 8 to 11 may be repeated for all of the restraints 20 utilized to secure the heat sink, until a uniform and known hold-down force has been applied. Where multiple restraints are utilized to hold-down a heat sink, it may be desirable to alternatingly turn each of the restraints so that there is a more uniform increase in the hold-down force across the surface of the processor. It should also be recognized that the restraints may be removed by turning the housings 28 in the opposite direction until the ends 24 are no longer threadably engaged.

The terms "comprising," "including," and "having," as used in the claims and specification herein, shall be considered as indicating an open group that may include other elements not specified. The term "consisting essentially of," as used in the claims and specification herein, shall be considered as indicating a partially open group that may include other elements not specified, so long as those other elements do not materially alter the basic and novel characteristics of the claimed invention. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A heat sink restraint, comprising:
   a fluid tight housing;
   a piston assembly including a piston and a shaft, the shaft extending through the housing and having first and second ends extending out of the housing through seals that allow axial movement of the shaft relative to the housing, and the piston disposed within the housing and coupled to the shaft for axial movement with the shaft;
   a dampening fluid filling the housing about the piston assembly;
   a dampening orifice or passageway establishing restricted fluid communication between regions within the housing above and below the piston; and
   a spring disposed within the housing and having one end engaging the piston assembly and a second end engaging the housing to bias the housing in a retaining direction.

2. The heat sink restraint of claim 1, wherein the shaft has a first end that is threaded for threaded coupling to a circuit board, a motherboard or a heat sink retention module via rotation of the shaft.

3. The heat sink restraint of claim 2, wherein the shaft has second end having a visual indicator for indicating the amount of axial displacement of the shaft relative to the housing.

4. The heat sink restraint of claim 3, wherein the visual indicator moves into the housing under continued rotation of the threaded shaft first end of the after the housing engages a heat sink.

5. The heat sink restraint of claim 3, wherein the visual indicator of the shaft has a series of markings spaced apart along its length above the housing.

6. The heat sink restraint of claim 1, wherein the dampening orifice or passageway is between the piston and the walls of the housing.

7. The heat sink restraint of claim 1, wherein the dampening orifice or passageway is one or more holes through the piston.

8. The heat sink restraint of claim 1, wherein the housing is cylindrical.

9. An apparatus, comprising:
   a circuit board;
   a semiconductor device coupled to the circuit board;
   a heat sink; and
   a plurality of restraints coupled to the circuit board and securing the heat sink in thermal communication with the semiconductor device, each restraint including:
   (a) a fluid tight housing;
   (b) a piston assembly including a piston and a shaft, the shaft extending through the housing and having first and second ends extending out of the housing through seals that allow axial movement of the shaft relative to the housing, and the piston disposed within the housing and coupled to the shaft for axial movement with the shaft;
   (c) a dampening fluid filling the housing about the piston assembly;
   (d) a dampening orifice or passageway establishing restricted fluid communication between regions within the housing above and below the piston; and
   (e) a spring disposed within the housing and having one end engaging the piston assembly and a second end engaging the housing to bias the housing in a retaining direction.

10. The apparatus of claim 9, wherein the shaft has a first end that is threaded for threaded coupling to the circuit board via rotation of the shaft.

11. The apparatus of claim 10, wherein the shaft has second end having a visual indicator for indicating the amount of axial displacement of the shaft relative to the housing.

12. The apparatus of claim 11, wherein the visual indicator of the shaft has a series of markings spaced apart along its length above the housing.

13. The apparatus of claim 9, wherein the dampening orifice or passageway is between the piston and the walls of the housing.

14. The apparatus of claim 9, wherein the dampening orifice or passageway is one or more holes through the piston.

15. The apparatus of claim 10, wherein the circuit board is a motherboard.

16. The apparatus of claim 9, further comprising a heat sink retention module coupled to the circuit board substantially around the device wherein the first threaded end of the shaft is coupled to the heat sink retention module.

17. The apparatus of claim 9, wherein the housing is cylindrical.

* * * * *